Aug. 29, 1967 R. H. WOODWARD 3,339,148
ADJUSTABLE ASTRONOMIC OSCILLATOR CONTROLLED BY ATOMIC OSCILLATOR
Filed Sept. 14, 1966 2 Sheets-Sheet 1

INVENTOR:

Richard H. Woodward
by Roberts, Cushman & Grover
ATT'YS.

United States Patent Office
3,339,148
Patented Aug. 29, 1967

3,339,148
ADJUSTABLE ASTRONOMIC OSCILLATOR CONTROLLED BY ATOMIC OSCILLATOR

Richard H. Woodward, Belmont, Mass., assignor to Gorham Corporation, Providence, R.I., a corporation of Rhode Island Filed Sept. 14, 1966, Ser. No. 579,323
12 Claims. (Cl. 331—3)

This is a continuation-in-part of my application Ser. No. 326,847, filed Nov. 29, 1963.

The field of this invention is the comparison, correlation and control of electric wave frequencies, such as the operation of a timing oscillator at a precisely adjustable frequency under the control of a standard frequency; in the principal practical embodiment at the present time, the standard frequency is that of an atomic beam resonance oscillator to which is compared and by which is controlled a timing frequency that is required to conform very accurately to a precisely given astronomical time.

The development of procedures for locking the frequency of a practical timing oscillator to an essentially invariant, such as atomic resonance, frequency has provided time scales of heretofore unattainable accuracy. However, the general use of this technique has encountered the difficulty that the original atomical resonance frequencies (herein referred to as "atomic" frequencies) and the subharmonic frequencies at which the associated electronic oscillators are most conveniently operated on the one hand, and the frequencies of the various conventional astronomical time systems, such as Universal Solar Time (UT–2), Sidereal Time and Ephemeris Time (herein referred to as ("astronomic frequencies") on the other hand, are irrationally related. Furthermore, the relation between atomic and astronomical times varies appreciably over comparatively short periods of time. In terms of the "fractional offset" of a nominal carrier frequency of 18 kc. p.s. (compare "U.S. Naval Observatory, Time Service Notice No. 8, Nov. 18, 1959"), this offset *s* was $-170$ parts in $10^{10}$ (or 156 c.p.s.) in 1959, and $-130$ parts in $10^{10}$ (or 119 c.p.s.) in 1962. This corresponds to a 1959 cesium frequency of 9,192,631,614 cycles per UT–2 second and a 1962 cesium frequency of 9,192,613,119 cycles per UT–2 second.

Prior efforts aimed at providing a standard frequency usefully related to astronomical time have attempted to operate an oscillator which is directly controlled by atomic resonance, at a frequency from which that of the atomic resonance is synthesized by means of tuned periodic circuitry. Such apparatus for synthesizing an atomic resonance frequency is, however, relatively inflexible because the ratio of a synthesized driving frequency to the various astronomic frequencies tied to conventional timing systems cannot be altered without the adjustment or rebuilding of a plurality of circuits. Furthermore, it is extremely difficult to synthesize an atomic resonance driving signal which does not contain spurious side bands at frequencies close to the desired frequency. These side bands are apt to cause jitter in the servo-loop system used to control the primary oscillator of the atomic resonance device, and introduce instability in the operating frequency of that oscillator.

While the above outlined specific field of absolute timing presents at this time the principal application of the system according to the present invention, it will be understood that this system can be applied to analogous situations, wherever irrationally related frequencies have to be compared, somehow correlated or one controlled by another, to any desired degree of accuracy.

Objects of the present invention are at this time principally, among others, to provide a system of frequency or pulse repetition rate which, though operating under the rigorous control of a natural atomic resonance, is yet so flexible that it can be easily and reproducibly adjusted to relate signal control frequencies with any degree of accuracy to any chose conventional time system; to provide such a system which can be adjusted to varying relations of astronomical and atomic times by way of simple aperiodic counter apparatus rather than periodically operating circuits; to provide such a frequency system which exhibits exceptional long-term as well as short-term stability; and to provide an atomic resonance controlled frequency standard delivering astronomical time signals, which involves only circuitry and requires only components that do not require critical adjustment, and are adaptable to various present day situations and requirements, including space travel, are comparatively rugged, reliable and simple in operation, long lived, and easy to maintain.

The nature and substance of the invention may be briefly stated as contemplating the comparison of two timing systems by expressing with any desired accuracy a number which correlates such two systems, by computing steps including a digital counting operation. In the present embodiments, the two frequencies to be compared are defined by astronomical and atomic events, respectively, and as such they are non-rationally related. For comparing such values, the possibility according to the invention of expressing their relation with any desired accuracy of approach to the non-rational relation, is especially valuable. This computation includes relating the frequencies by a rational number selected to have a digital value that furnishes a comparison frequency value of the same accuracy at which the said irrational number can be expressed. The rational digital relation can be selected at will and obtained with conventional logic apparatus.

Operationally desirable frequency values are preferably obtained by dividing and mixing the two original oscillator frequencies. A herein so-called "residual" frequency can thus be obtained by removing digital orders from the atomic resonance frequency. For purposes of the described embodiments, from a selected astronomical frequency of an adjustable timing oscillator there is first obtained, by conventional, tuned frequency synthesizing circuitry, a lower frequency which is then digitally further modified such as reduced, with aperiodic counting circuitry to furnish a herein so-called "comparison" frequency which can be made, with any desired accuracy, equal to the residual frequency by adjusting the astronomical timing oscillator.

The frequency reducing operation is preferably performed, according to a principal aspect of the invention, with the aid of counting time periods by means of a preset digital such as binary counter. These periods are derived from the output wave of the astronomical, adjustable timing oscillator. The residual frequency is preferably obtained by heterodyning and dividing frequencies derived from both original frequencies.

The actual, conventional timing frequency or pulse rate is obtained by servo adjustment of the constant phase relation of the residual and comparison frequencies.

In an important general aspect, the invention contemplates the complete removal of frequency synthesizing transfer operations from the primary beam resonance loop to a secondary loop which is related to the primary loop only through the output of the atomic oscillator, whereby any detrimental effect of actual timing in the secondary loop is excluded from the primary loop.

These and other objects, aspects of novelty, and advantageous results of the invention will appear from the following description of its principle and mode of operation and of several practical embodiments illustrating its novel characteristics.

The description refers to drawings in which

Figure 1:
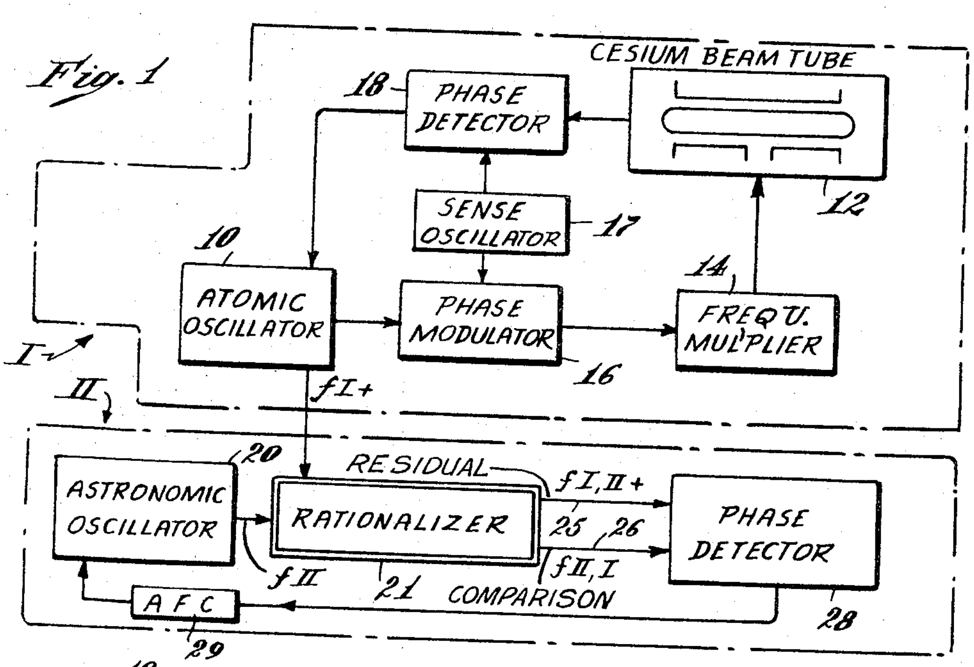
FIG. 1 is a diagram illustrating the method according to the invention.

As indicated in the simplified block diagram of FIG. 1, the technique according to the present invention for comparing frequencies such as of an atomic resonance standard and of a conventional timer, separates the function of frequency rationalization from the function of controlling an oscillator by atomic resonance. Each of these functions is performed by a servo loop.

The primary servo loop I operates to maintain oscillator 10 at a frequency obtained from the atomic resonance frequency of the beam tube 12. As mentioned above, the operating frequency of this atomic oscillator is irrationally related to any given astronomical time system. The primary servo loop thus performs the function of controlling an active frequency standard with an essentially passive resonator.

The secondary servo loop II operates to maintain an astronomical oscillator 20 (herein also referred to as secondary oscillator) at a frequency defined by any given conventional astronomical timing system, under the control of the atomic oscillator 10 (herein also referred to as primary oscillator) in the primary servo loop I. Since the primary loop provides at 10 an active self-contained frequency standard, the secondary loop is not needed for synthesizing the output frequency of the primary loop as has heretofore been proposed. Rather, the secondary loop operates by comparing two signals derived from the frequencies of the two oscillators 10 and 20. The first of the signals to be compared as mentioned above, called residual frequency *f*I, II herein, is obtained by mixing pairs of signals, the frequency of one signal being related to the frequency *f*I+ of the atomic or primary loop oscillator 10, and that of the other signal being related to the operating frequency *f*II of the astronomical or secondary loop oscillator 20. The frequency *f*II deviates from the frequency *f*I+ of the atomic loop oscillator.

The second of the signals to be compared, herein referred to as comparison signal *f*II, I is obtained by digitally counting periods of the frequency *f*II of the astronomical loop oscillator 20 by means of scaller which furnishes a frequency equal to that of a frequency which corresponds to operation of the astronomical loop oscillator at the desired conventional timing frequency. The period counting from the astronomical frequency *f*II or a derivative thereof takes place with a digital accuracy of the same order of magnitude than that of the irrational factor *k*+ which relates the atomic resonance frequency to a given astronomical timing system. Thus, *f*I and *f*II can be compared with optimal accuracy. The mixing and counting down operations are indicated by block 21, the residual frequency channel is indicated at 25, and the comparison channel at 26. Any difference between the comparison frequency signal and the residual frequency signal is caused to yield error information such as by way of the control signal derived from a phase detector 28 that is suitable to correct the operating frequency at the secondary, astronomical loop, oscillator 20 according to conventional servo techniques, as indicated at 29. Changes of the operation frequency at the secondary oscillator to accommodate one or the other of the conventional timing standards can be easily accomplished by altering the period counting which determines the frequency of the comparison signal. Since the count down of a predetermining digital, such as binary, counter can be easily preselected, the frequency standard with two servo loops according to the invention is quite flexible and the output frequency from the second servo loop can be easily rationally related to any chosen time system. In this context and for purposes of the description of practical embodiments herein below, it should be kept in mind that the time periods obtained by digital counting and expressed for example in integral numbers of microseconds, are reciprocals of a corresponding frequency expressed for example in cycles per second.

A preferred embodiment of apparatus for carrying out the above outlined method will now be described. It will be understood that other apparatus can be used so long as it is capable of performing the various above described functions.

Figure 2:
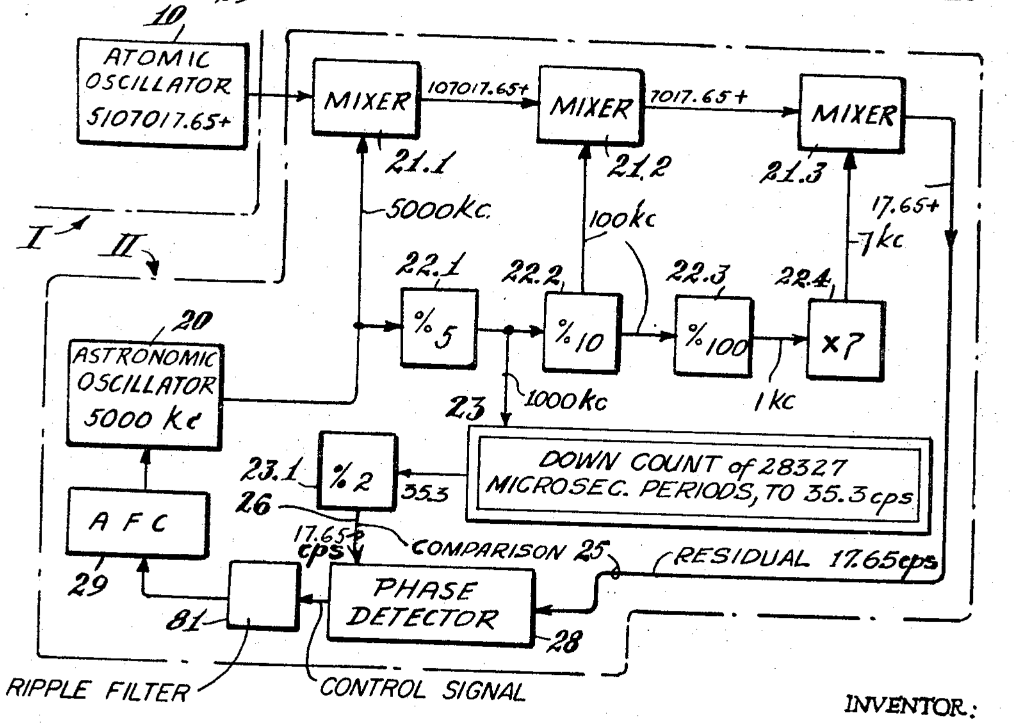
FIG. 2 is a block diagram of preferred apparatus for carrying out the method according to the invention.

Referring to FIG. 2, the frequency standard therein illustrated may be conveniently considered as comprising two parts, the primary loop section I of FIG. 1 includes the atomic beam resonator 12 and the atomic or primary oscillator 10, and the secondary loop section II which performs the above described frequency analyzing and period counting function and contains the astronomical or secondary oscillator 20.

As the operation of the primary loop section is well known in this art, it will be only briefly described. The atomic beam resonator 12 is preferably of the cesium beam tube type described in Patents Nos. 2,972,115 to Zacharias et al. and 3,076,942 to Holloway et al. It operates essentially as a passive resonator with regard to input frequencies applied thereto. The resonance frequency is very sharply defined but the information obtained from the output signal is only an indication as to whether or not a signal applied to the resonator is at the resonance frequency. At any given moment there is no indication as to whether the applied signal is above or below the resonance frequency. While the resonance frequency is very sharply defined for any one setting, it can be slightly adjusted by varying one of the fields applied to the beam tube, such as the field $B_c$ referred to in the above Zacharias patent, with the relation of field strength and frequency given in column 4 of that patent.

In the primary loop apparatus illustrated in FIG. 1, the resonator 12 is excited by a signal derived from a primary locked oscillator 10 operated at a frequency which is an integral submultiple of the resonator frequency. Because of the integral relation of the frequencies, a signal at the resonance frequency can be obtained by relatively simple frequency multiplications, as by the frequency multiplier 14, so as to yield a signal of good spectral purity, that is without significant sidebands.

To obtain an indication as the magnitude and direction of any difference in frequency between the signal from the frequency multiplier 14 and the resonance frequency of the resonator 12, the signal from the oscillator 10 is phase modulated as at 16, with some low modulation frequency provided by the sense oscillator 17, so that the signal applied to the resonator 12 from the frequency multiplier 14 is modulated through the resonance frequency with a periodicity corresponding to the frequency of the sense oscillator 17. As as result, if the operating frequency of the oscillator 14 deviates from the desired subharmonic, the output signal from the resonator 12 will include a component at the frequency provided by the sense oscillator 17 and the relative phase of this component will depend upon the relation of the center frequency of the modulated signal applied to the resonator 12, to the atomic resonant frequency. A comparison, as in the phase detector 18, of the phase relation between the output signal from the resonator 12 and a signal taken directly from the sense oscillator 17 provides a signal which indicates the magnitude and direction of any difference in frequency between the operating frequency of the locked oscillator 10 and the corresponding submultiple of the atomic beam resonance frequency. This signal can be applied in conventional fashion to the oscillator 10 so as to reduce the difference according to conventional servo techniques.

In this manner a signal is obtained whose frequency is an integral submultiple of and is controlled by a natural atomic resonance frequency. Since, however, no elaborate frequency synthesis is performed in the primary loop, the operating frequency of the oscillator 10 is irrationally related to any given astronomical time system. The purpose and operation of the secondary loop section II, now to be described with reference to FIG. 2, is to provide a signal frequency which, though stabilized by the signal from the atomic primary oscillator 10, rationally approaches a given astronomical time system to a desired degree of accuracy. In FIG. 2, the primary loop section I is indicated merely by the oscillator 10 whose output is the only link between the two loops.

The rationalizing system of loop II has the above-mentioned adjustable secondary oscillator 20 which is under the control of the servo loop 29. Since, however, the primary, atomic loop section I functions as an active frequency standard, with a signal voltage available from the primary oscillator 10, there is no need for an elaborate frequency synthesis as is required in the above discussed prior art systems. As distinct from such synthesis, the atomic frequency coming from the primary loop section I is analyzed by successive heterodyning.

In a preferred embodiment the secondary loop oscillator 20 is operated at 5 megacycles and the primary loop oscillator 10 is operated at an integral subharmonic of the resonator frequency, near 5 megacycles. With a cesium beam tube resonator the oscillator 10 can be operated at a frequency of 5,107,017.65+ cycles per second, which is the atomic cesium frequency in terms of Ephemeris time, divided by 1800 in the primary loop. For purposes of rationalization as described above with reference to block 21 of FIG. 1, the output signals from the two oscillators 10 and 20 are heterodyned in a mixer 21.1 to produce a signal at approximately 107 kilocycles. The operating frequency of the oscillator 20 is also divided by 5 and 10, as by frequency dividers 22.1 and 22.2 to obtain a signal at 100 kilocycles which is heterodyned by the mixer 21.2 with the 107+ kilocycle signal, coming from the first mixer 21.1, to yield a signal of approximately 7 kilocycles. The 100 kilocycle signal is again divided by 100 in the divider 22.3 and then frequency multiplied by 7 in the multiplier 22.4 to produce a 7 kilocycle signal. This 7 kilocycle signal, which derives its timing solely from the oscillator 20, is heterodyned, with the 7,017.65 c.p.s. signal from the mixer 21.2, in a third mixer 21.3 to yield a signal whose frequency, when the oscillators 10 and 20 are operating exactly at the frequencies stated, is 17.65+ cycles per second. This is the signal herein referred to as the residual frequency signal. It should be noted at this point, however, that this residual frequency signal coming from the mixer 21.3 deviates in frequency substantially at equal numbers of cycles with the operating frequency of the adjustable oscillator 20. In other words if the operating frequency of the oscillator 20 shifts by a given number of cycles per second, the residual frequency signal from the mixer 21.3 will shift in frequency a nearly equal number of cycles per second even though the two frequencies themselves are of completely different orders of magnitude.

Consequently, a small percentage change of the operating frequency of the secondary loop will cause a much greater percentage change of the residual frequency.

The sum of the various frequencies derived by dividing from the secondary loop oscillator 20, which are consecutively subtracted in the mixers 21.1/.2/.3 from the signal coming from the primary loop oscillator 10, can be conveniently thought of as an approximation of the primary loop frequency omitting its last four digits. It is a decided advantage of the present invention that this sum frequency is not synthesized since that would create many problems in selective filtering.

It will be evident that the subtractive approximation process removes several significant figures of higher digital order from the atomic primary loop frequency to arrive at the residual frequency signal. Therefore, the residual frequency 25, being the residual lower order number of significant figures, is representative of the operating frequency of the secondary loop oscillator 20 to the total number of significant figures. Accordingly, if the residual frequency signal is phase-locked, by a conventinoal servo loop operating on the oscillator 20, to a comparison frequency 26 which is accurate to within only the residual number of significant figures, the frequency of the oscillator 20 itself will be controlled with an accuracy equal to the total number of significant figures.

Figure 3:
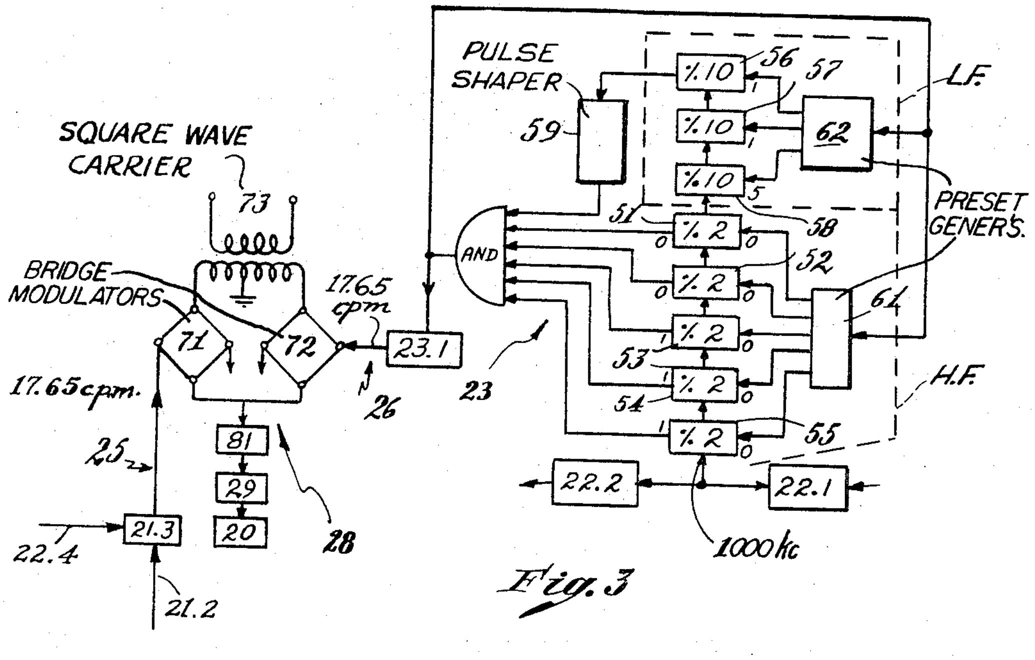
FIG. 3 is a circuit diagram of the counter and of the phase detector which are components of FIGS. 1 and 2.
Figure 4:
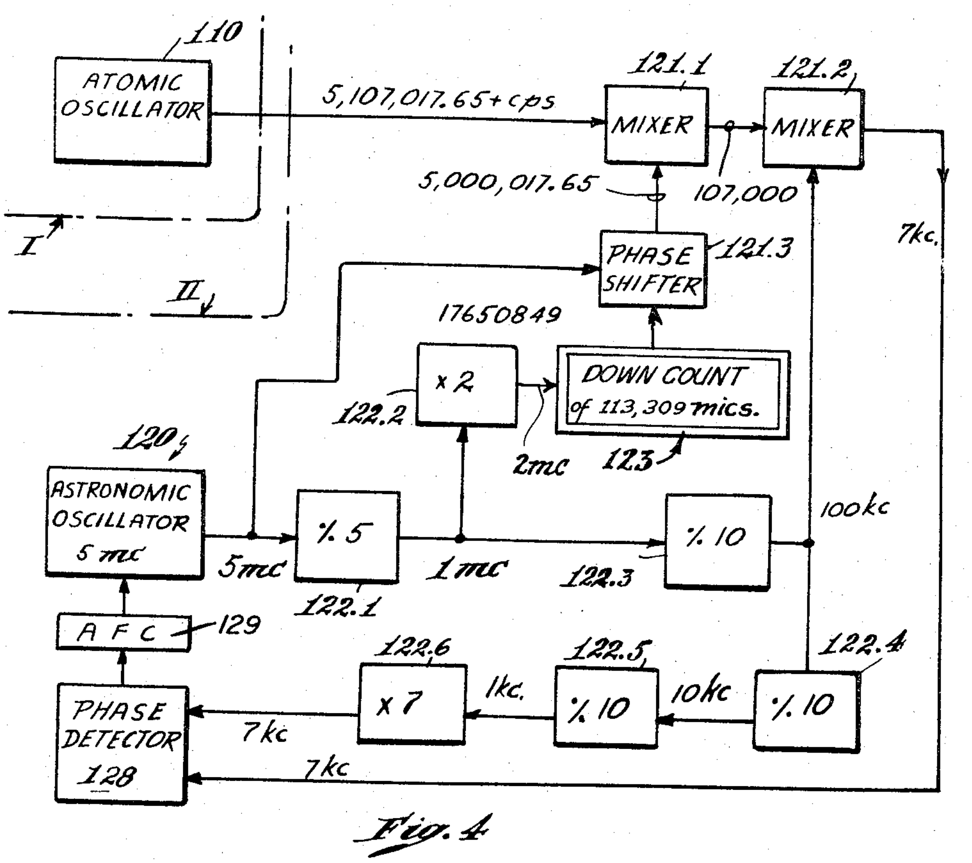
FIG. 4 is a block circuit diagram similar to FIG. 2 of another embodiment of apparatus for carrying out the method.

The comparison frequency can safely be synthesized because it is small in relation to the oscillator frequency and need be accurate only to the remaining number of significant figures. The synthesis can be simply and flexibly performed by an automatically presetting digital counter or scaler 23 such as illustrated in FIG. 3, driven by oscillator 20 through the frequency divided 22.1. In order to provide a scaler output approaching the residual frequency such as at 25, periods corresponding to the latter frequency have to be generated by the scaler receiving a given input wave. In the present embodiment, the scaler input frequency of 1000 kc. has to be converted to the residual frequency of 17.65 cycles per second. This frequency has the reciprocally related period of 56,654 micro-seconds and is generated by counting an appropriate number of one microsecond periods of the 1000 kc. input wave, the counter resetting itself after scaling off $$2\times 28{,}327=56{,}654$$

such one microsecond periods of the 1000 kc. control input, which furnishes a frequency of 35.3 cycles per second. By dividing that in half such as at 23.1, the required residual frequency of 17.65 c.p.s. is obtained. It will be evident that many variations of this counting technique are possible, the numerical values depending on the particular counter control frequency derived from the secondary oscillator 20, and the selected residual frequency, derived from the primary oscillator 10. The embodiment to be described with reference to FIG. 4 illustrates one such variation. The result of these successive frequency reductions is to provide a comparison signal whose frequency is 17.65 cycles per second as indicated in FIG. 2. It will be noted that this frequency is derived only from oscillator 20 and hence proportional to the operating frequency of that oscillator.

The phase relation of the comparison signal 26 derived from the presetting digital counter 23 and the residual signal 25 obtained by the successive heterodyning process, is determined by the phase detector 28, and the output signal of the phase detector is used to control the oscillator 20, the sense of the control being such as to equalize and phase lock the compared signals. A phase detector suitable for this purpose is illustrated in FIG. 3. As mentioned above, the frequency of the residual signal obtained by heterodyning changes greatly with relatively small changes in the operating frequency of the oscillator 20, and the frequency of the signal obtained by counting down changes only in proportion to the operating frequency of the oscillator 20. Therefore, the control thus exercised over the secondary oscillator 20 is very tight and its operating frequency is very precisely defined in relation to the frequency of the atomic or primary loop oscillator 10 and, derivatively, in relation to the atomic resonance frequency controlling the primary loop.

While the control exercised over the oscillator 20 is thus very precise, the particular frequency at which that oscillator operates can be readily adjusted over a small range of changing the presetting count applied by the digital counter 23. In this way changes between astronomical time systems or arbitrary readjustments of a given time system, can be easily accomplished. As indicated in FIG. 2, timing pulses of variously scaled repetition rates can be derived from the secondary oscillator by means of the dividers 22.2/.3/.4 used for heterodyning, and if desired by means of additional dividers in FIG. 2.

Since the use of separate, secondary loop frequency apparatus permits the primary loop to be arranged in relative simple and non-critical form, the overall frequency stability of the system is excellent taken over either long or short term measurements.

The counter indicated as block 23 of FIG. 2 is schematically shown in FIG. 3. It is essentially a conventional preset counter designed to permit a combination of slow and fast binaries and consists of a high frequency section and a low frequency section. The high frequency section uses five conventional transistor binaries 51, 52, 53, 54, 55 and the low frequency section uses ten bits each of three decades of conventional magnetic-core binaries 56, 57, 58. A pulse shaper is indicated at 59. As explained above, the desired counter scale factor, here the integral number 28,327, is obtained by using the final counter output to preset the counter at the preset generators 61, 62 so that between the time the counter is preset and the next counter output occurs, exactly the required number of input pulses is received defining by their time interval periods the output frequency of the counter 23 which frequency is the reciprocal of these time intervals. For the count of 28,327, the binary counters 51 to 55 are set to count $2^5=32$, and the magnetic decade counters are set to count 885. The total count is thus $32 \times 885 = 28,320$. The counter is preset to pulse number 3680, and it resets at the count of 32,007. The difference is 28,327, the desired counter scale factor.

It will now be evident that, as mentioned above, the ratio between atomic and astronomical times can be varied, according to the invention, by changing a periodic binary counter unit instead of modifying and adjusting periodically operating synthesizing circuitry.

The phase detector indicated by blocks 28 in FIGS. 1 and 2 is illustrated together with the counter in FIG. 3. The phase detector is a balanced circuit with two bridge modulators 71, 72 which are operated in push-pull with a square wave carrier 73. The connections of these components within the secondary, astronomical, loop are clearly shown in FIG. 3 and indicated by corresponding numerals 20, 21.3, 22.1, 22.2. The bridge modulator quads are balanced to within 5 mv. over the entire operating temperature range. Instead of the above outlined circuitry, silicon transistor choppers can be used to advantage.

The A.C. ripple of the control signal from 28 is preferably removed with a simple R–C low pass filter indicated at 81.

The automatic frequency control 29 whose function is described above with reference to FIG. 1 is of conventional design, and operates by varying the C or L of the resonant component of the oscillator 20 to vary its frequency. It can be conveniently constructed with a time constant making it in effect operate as a low pass filter augmenting the filter 81.

In order further to illustrate the broader aspects of the invention, an alternative secondary loop device is shown in FIG. 4 whose arrangement is analogous to that of FIG. 2 and will be understood without detailed description. It will be noted that this circuit operates by eliminating the lower digits of the resonance frequency so that round integer frequency values are fed into the phase detector.

In the circuit according to FIG. 4, a series of frequency dividers and multipliers 122.1 to 122.6 derive simple multiples from the frequency of the astronomical secondary oscillator 120 of loop II which must be precisely locked in phase with the 5,107,017.65+ atomic oscillator 110 of loop I, the latter frequency being expressed, as explained, above, in Ephemeris time divided by 1800 in the primary loop. The irrational number ratio between the atomic primary and astronomical secondary frequences is here approached, with the accurary at which the primary frequency is expressed in Ephemeris time, by successive approximation with the above-mentioned multipliers, with mixers 121.1, 121.2, with the preset binary counter 123 and with phase shifter 121.3. In this embodiment, a frequency of 56,654.5 microseconds is generated by the counter that resets itself after counting 113,309 periods. In this example, with the scaler controlling input wave of 2000 kc., these are half second periods. As indicated by the appropriate frequency values applied to FIG. 4, the phase detector 128 receives frequencies of 7 kc. from both loops resulting in a signal which regulates the secondary oscillator 120 by way of the automatic frequency control 129.

The circuits denoted by the blocks of FIGS. 2 and 4 are conventional, deviations for accommodating the present reguirements being illustrated in FIG. 3. It will be understood that the selection, and adjustments of ratings of the commercially available components which are required for the proper functioning of the apparatus described, are routine and well-known to persons skilled in this art so that a detailed description thereof is not required. Magnetic core circuits are preferably utilized for the decade dividers and binary counters in addition to transistor circuitry, because the modern square loop magnetic materials are especially advantageous with regard to size, power consumption, ruggedness and reliability. It is one of the advantages of the present invention that full advantage can be taken of such components, in addition to the utilization of aperiodic counters for frequency ratio adjustment, instead of periodic circuitry.

As mentioned above, the resonance frequency of the cesium beam tube 12 can be adjusted to a slight degree by means of its weak, uniform, magnetic field. This can be put to practical use as follows. Conventional frequency synthesis by multiplication, division, and mixing permits adjustment to one part in $10^4$. The counting technique according to the present invention combined with frequency synthesis permits adjustment to one part in $10^{10}$. If the continuous fine adjustment at the beam tube is also used, adjustment to one part in $10^{13}$, or even better, can be attained.

While a particular embodiment has been shown by way of illustration, it should be understood that the present invention includes all modifications and equivalents falling within the scope of the appended claims.

I claim:

1. Apparatus for comparing an atomic resonance frequency and an astronomical frequency which frequencies are related by an irrational factor approximately expressed by a rational number, comprising:

first oscillator means controlled by said atomic frequency;

second oscillator means for defining an astronomical frequency;

down count means for deriving from the second oscillator means a comparison frequency that approximates the astronomical frequency with the accuracy at which said irrational factor is expressed by said rational number;

phase detecting means for comparing a residual frequency signal derived from said first oscillator means with said comparison frequency, to derive a control signal; and means for controlling the second oscillator means with said control signal.

2. Apparatus according to claim 1 wherein said down count means includes aperiodic digital period counting means.

3. Apparatus according to claim 1 further comprising means for mutually adjusting said atomic frequency and said comparison frequency to interlock said first and second oscillator means, respectively.

4. Apparatus according to claim 2 further comprising frequency dividing and subtracting means inserted between the first and second oscillator means and the down count means.

5. Apparatus for comparing a standard timing system whose frequency is rationally related to astronomical time, with an absolute atomic resonance frequency which is irrationally related to said standard system frequency, comprising:
means for deriving a residual frequency from said atomic resonance frequency;
means for generating an astronomical time frequency;
means for counting from said astronomical time frequency a selected number of periods which define a comparison frequency to an accuracy which is of the same order as the accuracy with which the atomic resonance frequency can be expressed in terms of the astronomical time frequency; and
phase detecting means for relating said comparison frequency to said residual frequency to drive a control signal;
whereby the comparison of the resonance and astronomical frequencies can be carried out wholly apart from and without the astronomical frequency adversely affecting the atomic resonance frequency;
and whereby various astronomical time systems can be selected relative to the atomic resonance system by respective countings.

6. Apparatus according to claim 1, further comprising:
means for mixing at least one signal derived from the frequency of said first oscillator means with at least one signal derived from the frequency of said second oscillator means to derive said residual frequency signal such that its frequency deviates with deviations of the second oscillator means by frequency increments substantially equal to the deviation increments of said second oscillator means.

7. Apparatus according to claim 1, further comprising:
means for successively subtracting by heterodyning from the frequency of said first oscillator means a series of frequencies derived from the frequency of said second oscillator means to obtain said residual frequency signal such that its frequency deviates with deviations of the second oscillator means by frequency increments substantially equal to the deviation increments of said second oscillator means.

8. A frequency standard system for providing a signal at a desired standard timing frequency, comprising:
a primary frequency standard operating at a fixed frequency;
an adjustable oscillator for producing said standard timing frequency;
means for mixing at least one signal derived from the frequency of said primary standard with at least one signal derived from the operating frequency of said adjustable oscillator so as to obtain a residual frequency signal whose frequency deviates with deviations of the adjustable oscillator by frequency increments substantially equal to the deviation increments of said oscillator;
means for digitally counting periods of said oscillator frequency for providing a comparison frequency signal; and
means, responsive to the phase relation between said residual frequency signal and said comparison frequency signal, for adjusting said oscillator to minimal phase difference.

9. An adjustable frequency standard system for providing a signal at a desired standard timing frequency, comprising:
a primary frequency standard operating at a fixed frequency;
an adjustable oscillator for producing said standard timing frequency;
means for subtracting from the frequency of said standard a frequency which is derived from the operating frequency of said adjustable oscillator to obtain a residual frequency signal whose frequency deviates with deviations of the adjustable oscillator by frequency increments substantially equal to the deviation increments of said oscillator;
digital counter means driven by said adjustable oscillator for providing a comparison frequency signal equal in frequency to that residual frequency which exists when said adjustable oscillator operates at said desired frequency; and
means, responsive to the phase relation between said residual frequency signal and said comparison frequency signal for adjusting said oscillator toward the desired frequency.

10. An adjustable frequency standard system for providing a signal at a desired timing frequency, comprising:
a primary frequency standard operating at a fixed frequency;
an adjustable oscillator for producing said standard timing frequency;
means for successively heterodyning the output signal of said oscillator and subharmonics thereof respectively, with the output signal of said standard and previous results of said heterodyning so as to obtain a residual frequency signal which deviates with deviations of the adjustable oscillator by frequency increments substantially equal to the deviation increments of said oscillator;
digital counter means driven by said adjustable oscillator for providing a comparison frequency signal equal in frequency to that residual frequency which exists when said adjustable oscillator operates at said desired frequency; and
means, responsive to the phase relation between said residual frequency signal and said comparison frequency signal for adjusting said oscillator towards the desired frequency.

11. In combination with an atomic beam stabilized frequency standard of the type in which the excitation energy for the atomic beam is derived from a locked oscillator operating at a frequency which is an integral subharmonic of the atomic beam resonance frequency,
frequency rationalizing apparatus comprising:
an adjustable oscillator operable at a useful frequency near the frequency of said locked oscillator;
means for subtracting successively from the frequency of said locked oscillator, a series of frequencies derived from the operating frequency of said adjustable oscillator, to obtain a residual frequency signal which deviates with deviations of the adjustable oscillator by frequency increments substantially equal to the deviation increments of said oscillator;
means for digitally counting periods of the operating frequency of said adjustable oscillator to obtain a comparison frequency signal which is equal in frequency to said residual frequency corresponding to operation of said adjustable oscillator at a desired frequency; and
means, responsive to the phase relation between said residual frequency signal and said comparison frequency signal, for adjusting said oscillator so as to reduce the phase difference.

12. In combination with a cesium beam stabilized frequency standard of the type in which excitation energy for the cesium beam is derived from a locked oscillator operating at a frequency which is an integral subharmonic of the cesium resonance frequency,
adjustable frequency standard apparatus for providing a signal at a desired frequency comprising:
an adjustable oscillator operable at frequencies near the frequency of said locked oscillator;
means for successively subtracting from the frequency of said locked oscillator a series of frequencies derived from the operating frequency of said adjustable oscillator to obtain a residual frequency signal which deviates with deviations of the adjustable oscillator by frequency increments substantially equal to the deviation increments of said oscillator;

automatically presetting counter means for digitally counting periods of the operating frequency of said adjustable oscillator, the prevailing count being adjustable to obtain a comparison frequency signal whose frequency is equal to that residual frequency corresponding to operation of said adjustable oscillator at said desired frequency; and means, responsive to the phase relation of said residual frequency signal and said comparison signal, for adjusting said oscillator toward said desired frequency.

References Cited

UNITED STATES PATENTS

| | | | |
|---|---|---|---|
| 2,490,500 | 12/1949 | Young | 331—25 |
| 2,581,594 | 1/1952 | MacSorley | 331—22 X |
| 2,972,115 | 2/1961 | Zacharias et al. | 331—3 |
| 3,166,888 | 1/1965 | Kartaschoff | 331—3 X |

ROY LAKE, *Primary Examiner.*

S. H. GRIMM, *Assistant Examiner.*